United States Patent [19]

Guillaumin

[11] Patent Number: 4,677,316
[45] Date of Patent: Jun. 30, 1987

[54] LOGIC CIRCUIT WITH THRESHOLD AND BUILT-IN SAFETY

[75] Inventor: Jacques Guillaumin, Les Lilas, France

[73] Assignee: Jeumont-Schneider Corporation, Puteaux, France

[21] Appl. No.: 659,552

[22] Filed: Oct. 10, 1984

[30] Foreign Application Priority Data

Oct. 13, 1983 [FR] France .................. 83 16331

[51] Int. Cl.$^4$ ........................................ H03K 19/007
[52] U.S. Cl. .................. 307/442; 307/200 A; 307/443; 307/355; 307/310
[58] Field of Search .............. 307/200 A, 442, 443, 307/491, 494, 354, 355, 240, 570, 296 R, 310

[56] References Cited

U.S. PATENT DOCUMENTS

| | | | |
|---|---|---|---|
| 3,995,173 | 11/1976 | Sibley | 307/442 |
| 4,125,784 | 11/1978 | Harrison | 307/442 |
| 4,130,764 | 12/1978 | Darrow | 307/442 |
| 4,549,099 | 10/1985 | Yamada et al. | 307/551 X |

FOREIGN PATENT DOCUMENTS 2510845 2/1983 France .

Primary Examiner—Stanley D. Miller
Assistant Examiner—D. R. Hudspeth
Attorney, Agent, or Firm—Rines and Rines, Shapiro & Shapiro

[57] ABSTRACT

The invention pertains to a logic circuit with threshold and built-in safety such that any change in the characteristics of its components produces a relative increase of the threshold value. It comprises a comparator (7) one input of which receives a reference d-c voltage (VR) whereas the other input is connected to the junction point of a first and a second resistance (1, 2). A first d-c voltage (V1) of low relative value is applied to the free terminal of the first resistance (1), and a second d-c voltage (V2) of high relative value is applied to the free terminal of the second resistance (2) by means of a third resistance (3). According to the invention, there is applied at the junction point (A) of the second and third resistances (2, 3) a third d-c voltage (V3) of intermediate relative value by means of a fourth resistance (4) in series with a chopping commutator (6).

10 Claims, 9 Drawing Figures

LOGIC CIRCUIT WITH THRESHOLD AND BUILT-IN SAFETY

This invention pertains to a logic circuit with threshold and built-in safety, having at least one input and one output and constructed such that no failure or modification of the circuit characteristics can result in an output signal if the threshold is not reached.

Such safety circuits are used particularly in railroad signaling systems in devices for detecting passage of a car on a track. The circuits must therefore satisfy rigorous safety standards.

French Pat. No. 2 510 845 describes one such circuit with two inputs and one output, supplied between a non-zero d-c voltage Vcc and ground, comprising in combination a diode pump, an intermediate subassembly and a transistor at the output mounted in common emitter configuration. During operation under certain conditions this circuit may not have any safety. In a first case, if a cutting of the resistance located between the supply conductor at the Vcc voltage and the bsase of the output transistor should combine with leaks between the collector and the base of this same transistor, the circuit can continue to have an output signal whose amplitude is such that it does not permit detecting the failure of the device, contrary to safety requirements. In a second case, a leak between the base and the emitter of the same output transistor has a tendency to oppose the polarization provided by the above-mentioned resistance, thereby decreasing the value of the threshold and hence altering the safety of the device.

An object of the invention is to obviate these inconveniences and to provide a logic circuit such that any failure in the circuit should result in an increase of the threshold and, therefore, to a safety situation superior to that which prevailed prior to the incident.

Another purpose of the invention is to provide in a modular method, starting from the same basic logic circuit corresponding to a "YES" logic circuit, logic circuits providing other classical logic functions.

In summary, according to this invention, the logic circuit with threshold and built-in safety comprises a comparator one input of which receives a reference d-c voltage and the other input of which is connected to the junction point of a first and a second resistance. A first d-c voltage of low relative value is applied to the other end of the first resistance and a second d-c voltage of high relative value is applied to the other end of the second resistance by means of a third resistance. There is applied to the junction point of the second and third resistances a third d-c voltage of intermediate relative value, by means of a fourth resistance in series with a chopping commutator. The comparator preferably consists of a transistor mounted in a common base configuration, the base receiving the third d-c voltage. The emitter is connected to the junction point of the first and second resistances whereas the collector, to which the second d-c voltage is applied by means of a fifth resistance, constitutes the comparator output. This transistor is preferably of the npn type, the first voltage being negative, the second voltage having a positive value and the third voltage being null. However, the various polarizations can be reversed by using a pnp transistor. To operate this circuit with an alternating signal a first diode pump is placed at the input in such a manner as to transform this alternating signal into the first d-c voltage.

This circuit preferably includes a temperature compensation device comprising a number of diodes connected in such manner that they are in the forward conduction direction in series between the junction point of the third and fourth resistances and the second resistance.

The logic circuit described above permits providing other safety logic circuits, namely, the logic functions "AND" and "OR".

An "AND" logic circuit for two alternating signals is provided by supplying the commutator of the "YES" logic circuit with an alternating signal, the other being applied to the above-mentioned diode pump.

An "OR" logic circuit for several alternating signals is obtained by connecting several diode pumps in parallel with the first diode pump of the "YES" logic circuit.

An "AND" logic circuit for several alternating signals is obtained by connecting several diode pumps in series with the first diode pump of the "YES" logic circuit and by increasing the value of the circuit threshold.

For any one of the described logic circuits the transistor collector is preferably connected to a current amplifier consisting of transistors mounted in common collector and of complementary types, the junction of the bases of constituting the input and the junction of the emitters constituting the output, with the second and third d-c voltages respectively applied to the collectors.

This invention will be better understood and other purposes, advantages and characteristics will appear more clearly by reading the following description of a method of applying the invention and referring to the three attached drawings.

Figure 1A:
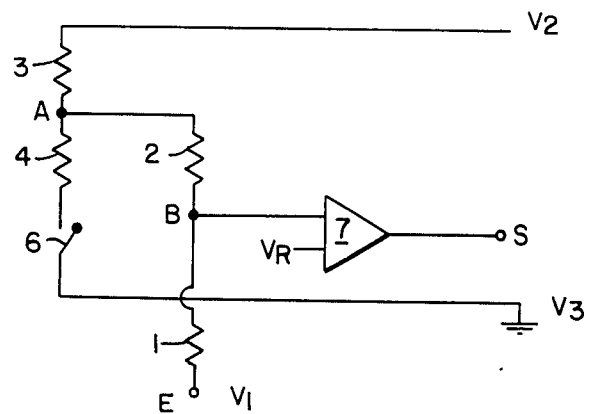
FIG. 1a is the electronic diagram of a basic logic circuit according to the invention.

Referring now to FIG. 1a which shows a method of applying the logic circuit according to the invention, the d-c voltage of low relative value is chosen to be negative (V1), that of high relative value is chosen to be positive (V2) and that of intermediate value is chosen to be null (V3).

On the one hand, a commutator 6 is connected directly to ground (V3), and on the other hand, to the voltage V2 by means of the two resistances 3 and 4. The commutator chops the current in these two resistances and creates at the junction point A of these two resistances 3 and 4 a signal in the form of a square wave with peak voltages V2 and KV2, k being a function of the values of the resistances 3 and 4 and less than 1.

If the commutator 6 remains open, the voltage VA at point A increases and no square-wave signal is transmitted to the comparator 7 which then supplies a direct signal output. The same is true if the resistance 4 is cut. If the resistance 3 is cut, the voltage VA drops and the square-wave signal no longer has sufficient amplitude to switch over the comparator 7. If the resistance 2 is cut, obviously no signal is transmitted to the comparator 7.

Hence, it can be seen that this circuit definitely has the required built-in safety feature particularly because the useful signal applied to the comparator 7 should be the sum of a square-wave signal and a d-c voltage and should show a determined amplitude included between two terminals in order that the comparator 7 can provide its function.

The comparator 7 is arranged in such manner that a reference voltage VR is applied to one of its inputs whereas its other input is connected to the junction point B of the two resistances 1 and 2. The negative voltage V1 is applied to the other end E of the resistance 1 whereas the other end of the resistance 2 is connected to the aforementioned point A. The comparator 7 includes an output S which constitutes the output of the logic circuit.

The square-wave signal is transmitted from the point A to the point B by the resistance 2. The negative voltage V1 applied to the point E is transmitted to the point B by the resistance 1. Therefore, at the point B there appears a square-wave signal having peak voltages U and V, U and V being a function of the voltages V1 and V2, and of the resistances 1, 2, 3 and 4.

Figure 1B:
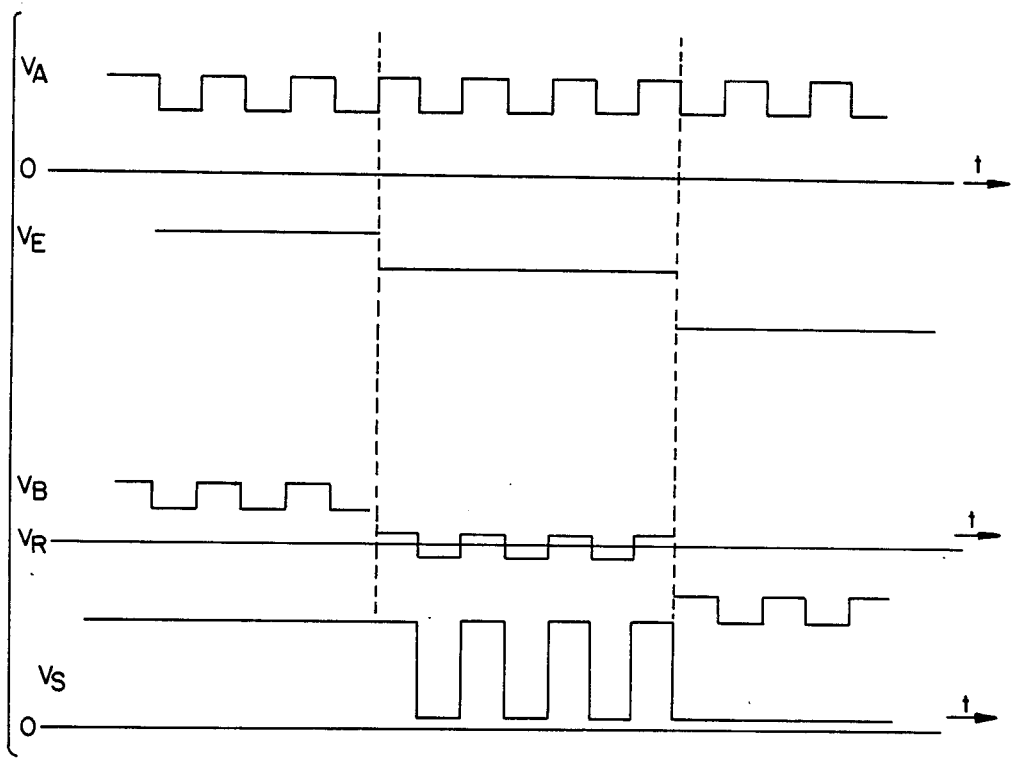
FIG. 1b is a time diagram of certain signals appearing in the circuit, serving to explain its operation.

FIG. 1b shows the voltages at the points A and B and at output, in function of time and of the voltage applied at the point E, in order to explain the operation of the device.

On the left-hand portion of this diagram it can be seen that if the voltage applied at E is not sufficiently negative, the voltage at the point B does not sufficiently approach the reference voltage VR to permit commutator 6 to operate as in the central portion of this figure where it can be seen that the output voltage VS becomes a square-wave only if the voltage VB cuts the reference voltage VR. Similarly, on the right of the figure it can be seen that if the voltage VE is too negative, the commutator 6 no longer operates.

On FIGS. 2, 3, 4, 5, 6 and 7 the same references designate the same elements as on FIG. 1a with the same functions.

Figure 2:
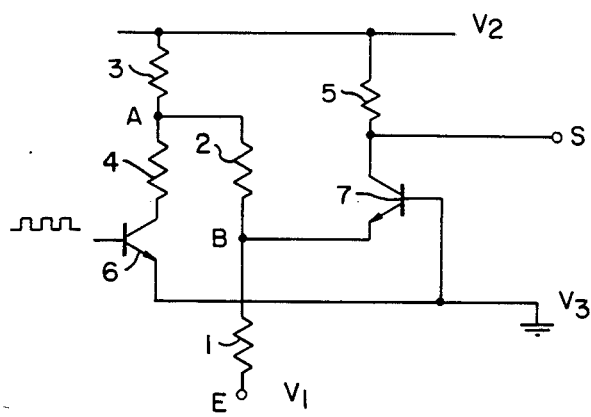
FIG. 2 is the electronic diagram of the logic circuit shown in FIG. 1a where a transistor mounted in common base configuration has been substituted for the comparator.

Referring to FIG. 2 which shows a logic circuit according to the invention as shown in FIG. 1a, the comparator has been provided through the use of a transistor 7 mounted in common base, configuration and the commutator 6 by means of a transistor shown schematically, for example, commanded by a clock.

The base-emitter voltage of the transistor 7 corresponds to the reference voltage VR, applied to an input of the comparator of FIG. 1a.

The point B is connected to the emitter of the transistor 7. The output signal is taken at the point S on the collector of this transistor, connected to the voltage V2 by means of a resistance 5.

It can be easily seen that the transistor 7 contributes to the built-in safety of the circuit. In fact, any leak between the collector and emitter produces an increase in the voltage at the point B resulting in an absence of output signal of the cicuit. In the case of a base-emitter leak the same is true but with less effect. Lastly, a base-collector leak results in a decrease of the amplitude of the output signal and thus the absence of square-waves in this signal.

Figure 3:
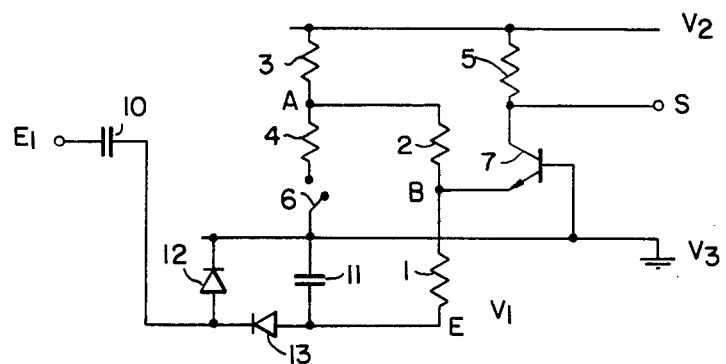
FIG. 3 is the electronic diagram of the preceding logic diagram to which is added a diode pump on the input of the circuit to which an alternating signal is applied.

FIG. 3 shows the logic circuit indicated in FIG. 2 to which a diode pump has been added. An alternating signal is applied to the point E1 which is an input of the circuit. The diode pump consists of a condenser 10 in series with a diode 12 whose cathode is grounded. This diode is shunted by a branch comprising a condenser 11 in series with a diode 13 connected in such manner that the cathode of the latter is connected to the anode of the diode 12. In a known manner, the pump transforms this alternating signal into a negative voltage V1 applied at the point E. The point E is connected to the junction point of the condenser 11 and the anode of the diode 13. The buffer condenser 11 connects point E to the ground (V3). The diode pump functions in a known manner. The condenser 10 charges first through the diode 12 then discharges into the condenser 11 through the diode 13 so long as the charge of the latter condenser is not sufficient for the diode 13 to remain blocked, which condition is reached at the end of some cycles. As a result, the voltage at the point E becomes more and more negative at each cycle of the input alternating signal applied at E1 until it stabilizes at a practically constant negative value V1.

This d-c voltage applied at the point E contributes to the safety of the circuit because it is negative. In fact, any incident happening in the diode pump brings this voltage towards ground.

The commutator 6 can be commanded either by a clock or by another alternating signal, the logic circuit then constituting an "AND" logic circuit for two alternating signals.

Figure 4:
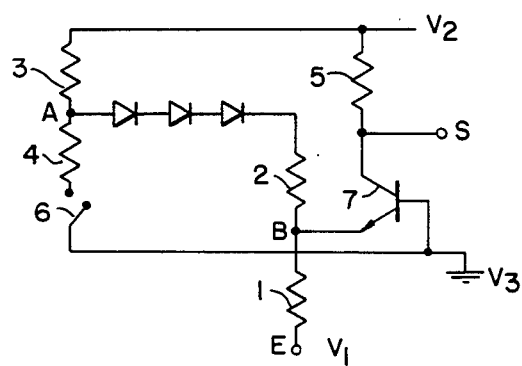
FIG. 4 is the electronic diagram of the logic circuit according to FIG. 2, perfected by a temperature compensation device.

Referring to FIG. 4, a compensation device in function of the supply voltage V2 and of the temperature is added to the logic circuit shown in FIG. 2.

Such a device is necessary since it is desired to keep the same ratio between the threshold voltage of the circuit and the supply voltage V2 under certain supply voltage and temperature conditions. It can be seen that this ratio increases if V2 or the temperature decreases and conversely that this ratio decreases if V2 or the temperature increases. This variation is due to the fact that the threshold voltage of the circuit depends upon the base-emitter voltage of the transistor and the voltage losses in the diodes if at least one diode pump is used, the characteristics of the diodes varying in function of the temperature.

The safety compensation device proposed here consists of three diodes connected in series and in the forward direction between the junction point of the resistances 3 and 4 and the resistance 2. If the temperature increases, the base-emitter voltage decreases, the voltage at the point E increases in absolute value if at least one diode pump is used, and under the effect of the three diodes the voltage at the point A increases. Overall therefore, the threshold voltage of the circuit does not decrease. Similarly, if the temperature decreases, the base-emitter voltage increases, the voltage at the point E decreases in absolute value if at least one diode pump is used, and under the effect of the three diodes the voltage at the point A decreases. Consequently, the threshold voltage of the circuit does not increase.

This compensation device also contributes to the safety of the device since if an incident occurs at the level of the diodes, either the voltage drop at the poles of these diodes decreases and the threshold voltage of the circuit increases, or no alternating signal is transmitted to the point B.

Figure 5:
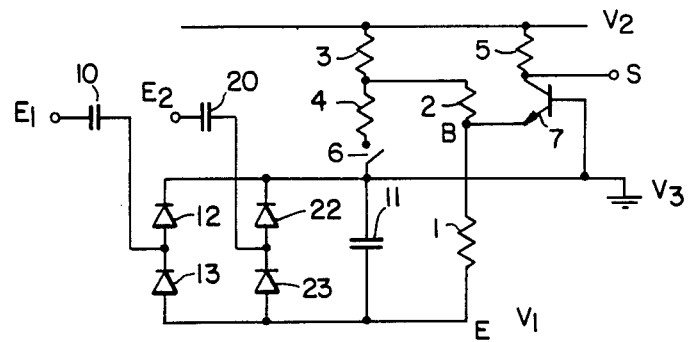
FIG. 5 is the electronic diagram of an "OR" logic circuit for two alternating signals according to the invention.

Referring to FIG. 5, an "OR" logic circuit for two alternating signals is obtained from the logic circuit shown in FIG. 1a by connectiing two diode pumps in parallel on the circuit input.

The first diode pump consists of condensers 10 and 11 and diodes 12 and 13; the second diode pump consists of condensers 20 and 11 and diodes 22 and 23; the condenser 11 is common to the two diode pumps.

Each diode pump transforms the alternating signal applied to an input of the circuit (E1, E2) into a negative voltage. The voltage V1, applied to the point E corresponds to the greatest of these two negative voltages, compared in absolute value. The threshold voltage of the circuit corresponds to that chosen by a circuit comprising only a single diode pump.

It is sufficient that an alternating signal is applied to one of the circuit inputs E1, E2 in order that the voltage at the point B permits a signal to appear at the point S, output of the circuit.

Figure 6:
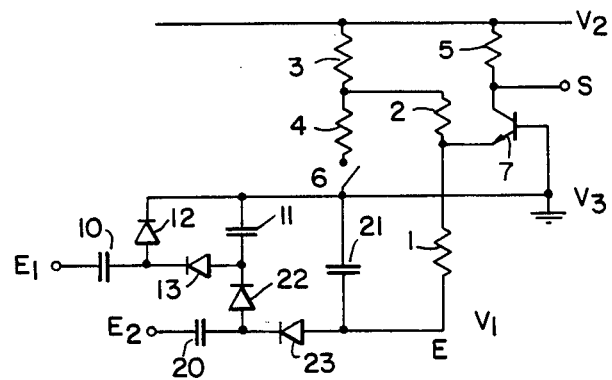
FIG. 6 is the electronic diagram of an "AND" logic circuit for two alternating signals according to the invention.

Referring to FIG. 6, a logic circuit "AND" for two alternating signals is obtained from the logic circuit shown in FIG. 1a by connecting two diode pumps in series on the circuit input.

The first diode pump consists of two condensers 10 and 11 and two diodes 12 and 13. The second consists of two condensers 20 and 21 and two diodes 22 and 23.

Each diode pump transforms the alternating signal applied to an input of the circuit (E1, E2) into a negative voltage E. The voltage V1, applied to the point E is the sum of these two voltages. To provide proper operation of the device, the threshold voltage of the circuit is increased by modifying the ratio of the resistance values 1 and 2.

An alternating signal must be applied to each input E1, E2 of the circuit in order that the voltage at the point B permits the appearance of a signal at the point S, output of the circuit.

Figure 7:
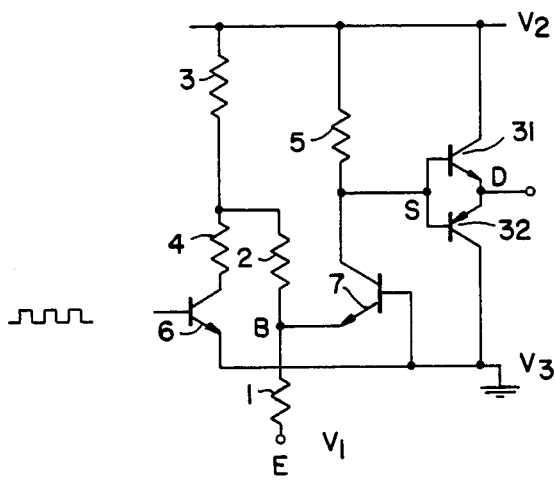
FIG. 7 shows a possible interface of the logic circuit indicated in FIG. 2 with other circuits, this interface providing current amplification.

Referring to FIG. 7, a current amplification device is added to the logic circuit shown in FIG. 2. In fact, such a device is often necessary since the previously described logic circuits can be connected to each other in a logic chain. In particular, since the transistor 7 of such a logic circuit is mounted in a common base configuration, it provides a current gain which is insufficient for connection of this logic circuit to another logic circuit.

The current amplification device shown here consists of two transistors 31, 32, mounted in common collector configuration and of complementary types. Their respective bases are connected to each other at the point S which constitutes the input of the device to which is applied the signal from the preceding logic circuit. Their respective emitters are connected at the point D which constitutes the output of the device, whereas their collectors are connected respectively to the supply voltage and to ground.

Figure 8:
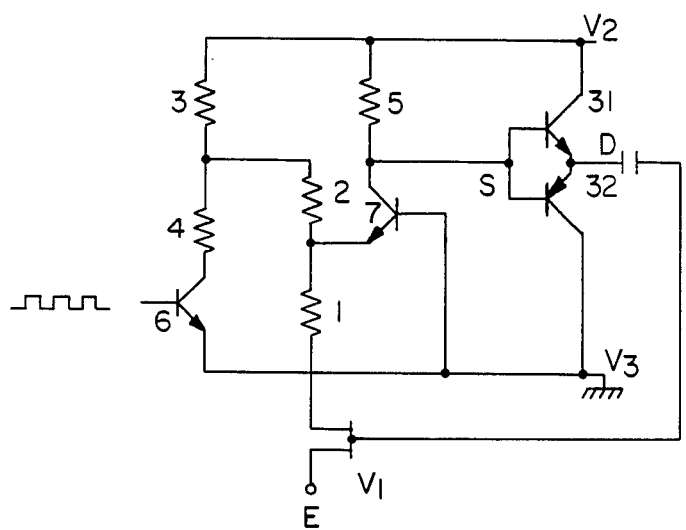
FIG. 8 shows a further embodiment of the invention.

Although only certain methods of application have been described, it is obvious that any modification provided by the knowledgeable person in the same spirit would not deviate from the framework of this invention. For example, the operating limit of the circuit can be modified by adding an active resistance in series with the resistance 1, for example, a field-effect transistor commanded directly by the output signal of the circuit in such a manner as to provide a self-regulation (FIG. 8). A "NO" gate can also be included in parallel by providing a transistor and applying the voltage VE at its base, its emitter being connected to the junction point of two resistances constituting a bridge between ground and the supply voltage V2, the chopping commutator being then arranged in series with one of the bridge resistances between the supply voltage and the transistor emitter. However, although a "NO" gate is never a built-in safety, it can be favorably combined with a "YES" gate in order to further increase the level of built-in safety.

What is claimed is:

1. A logic circuit with switching threshold and built-in safety such that any modification of the characteristics of one of its components produces a relative increase of the switching threshold value, comprising a comparator having one input connected to a point of reference d-c voltage, another input connected to a junction point of a terminal of a first resistance and a terminal of a second resistance, and an output connected to an output terminal of said logic circuit, said first resistance having another terminal connected to an input terminal of said logic circuit at a first d-c voltage, and said second resistance having another terminal connected by a third resistance to a point of second d-c voltage different from said first d-c voltage, characterized in that said another terminal of said second resistance is connected by means of a fourth resistance in series with a chopping commutator to a point of third d-c voltage intermediate said first d-c voltage and said second d-c voltage.

2. A logic circuit according to claim 1, characterized in that it comprises temperature compensation means including a plurality of diodes connected in series in the forward conduction direction between a junction point of said third resistance and said fourth resistance, and said another terminal of said second resistance.

3. A logic circuit according to claim 1, characterized in that it comprises converting means having an output connected to said another terminal of said first resistance for converting a first alternating signal applied to an input of said converting means to said first d-c voltage, and that said chopping commutator is controlled by a second alternating signal, said logic circuit thereby constituting an AND gate.

4. A logic circuit according to claim 1, characterized in that it comprises diode pump means having output means connected to said another terminal of said first resistance for converting at least one alternating signal applied to input means of said diode pump means into a negative d-c voltage constituting said first d-c voltage.

5. A logic circuit according to claim 4, characterized in that said diode pump means comprises a plurality of diode pumps connected in parallel, said logic circuit thereby constituting an OR gate for a corresponding plurality of alternating signals applied respectively to the respective inputs of said diode pumps.

6. A logic circuit according to claim 4, characterized in that said diode pump means includes a plurality of diode pumps connected in series, said logic circuit thereby constituting an AND gate for a corresponding plurality of alternating signals applied respectively to the respective inputs of said diode pumps.

7. A logic circuit according to claim 1, characterized in that said comparator includes a transistor connected in common base configuration, the base of said transistor being connected to said point of third d-c voltage, the emitter of said transistor being connected to said junction point of the respective first-mentioned terminals of said first and second resistances and constituting said another input of said comparator, the collector of said transistor being connected to said point of second d-c voltage by a fifth resistance and constituting said output of said comparator.

8. A logic circuit according to claim 7, characterized in that the collector of said transistor is connected to an input of a current amplifier.

9. A logic circuit according to claim 8, characterized in that said current amplifier includes two transistors of complementary types respectively connected in common collector configuration, a junction of the bases of said transistors constituting an input of said current amplifier, a junction of the emitters of said transistors constituting an output of said current amplifier, the collectors of said transistors being connected to said point of second d-c voltage and said point of third d-c voltage, respectively.

10. A logic circuit according to claim 7, characterized in that a field-effect transistor controlled by the output of said comparator is connected in series with said first resistance.

* * * * *